United States Patent
Nemoto

(10) Patent No.: US 6,643,310 B2
(45) Date of Patent: Nov. 4, 2003

(54) SEMICONDUCTOR LASER APPARATUS, LASER COUPLER, DATA REPRODUCTION APPARATUS, DATA RECORDING APPARATUS AND PRODUCTION METHOD OF SEMICONDUCTOR LASER APPARATUS

(75) Inventor: Kazuhiko Nemoto, Kanagawa (JP)

(73) Assignee: Sony Corporation, Tokyo (JP)

(*) Notice: Subject to any disclaimer, the term of this patent is extended or adjusted under 35 U.S.C. 154(b) by 44 days.

(21) Appl. No.: 09/792,244

(22) Filed: Feb. 23, 2001

(65) Prior Publication Data

US 2001/0055325 A1 Dec. 27, 2001

(30) Foreign Application Priority Data

Feb. 29, 2000 (JP) .................................. P2000-053764

(51) Int. Cl.[7] .............................. H01S 5/00; H01S 3/10
(52) U.S. Cl. ........................................... 372/50; 372/23
(58) Field of Search ....................................... 372/50, 23

(56) References Cited

U.S. PATENT DOCUMENTS 5,228,050 A * 7/1993 LaCourse et al. .............. 372/50
5,699,375 A * 12/1997 Paoli ............................. 372/50

FOREIGN PATENT DOCUMENTS

| JP | 6332986 | 2/1988 |
|---|---|---|
| JP | 5102613 | 4/1993 |

* cited by examiner

*Primary Examiner*—Quyen Leung
(74) *Attorney, Agent, or Firm*—Sonnenschein, Nath & Rosenthal LLP

(57) ABSTRACT

There is provided a semiconductor laser apparatus capable of individually optimizing oscillations at a plurality of light emitting units fabricated on the single substrate in accordance with usages of each emitted laser lights. A plurality of cavities (laser diodes A and B), which correspond to the plurality of light emitting units, are fabricated on single substrate. And cavity lengths of the cavities are fabricated to different from one another.

24 Claims, 10 Drawing Sheets

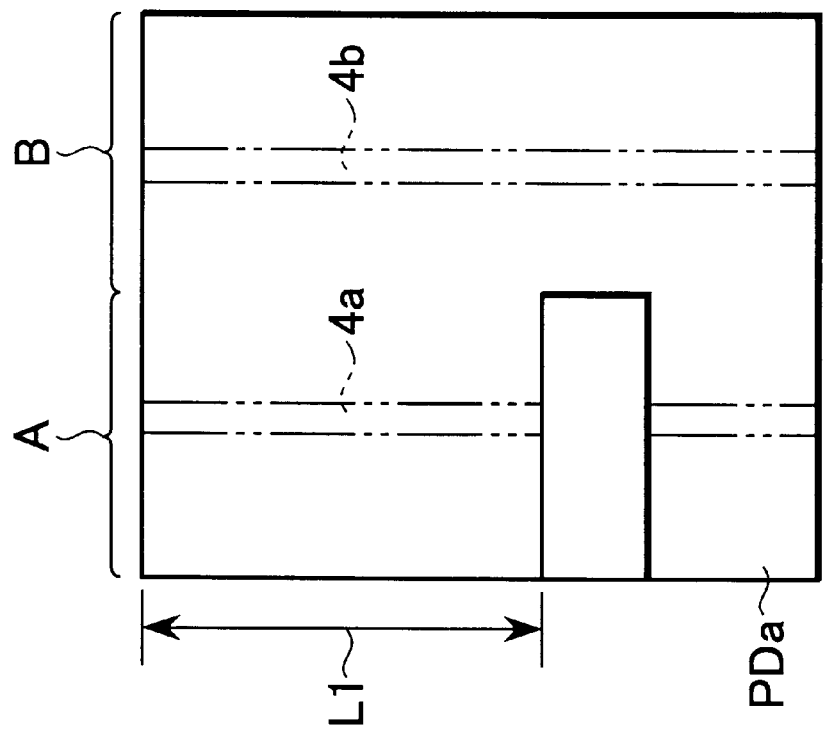
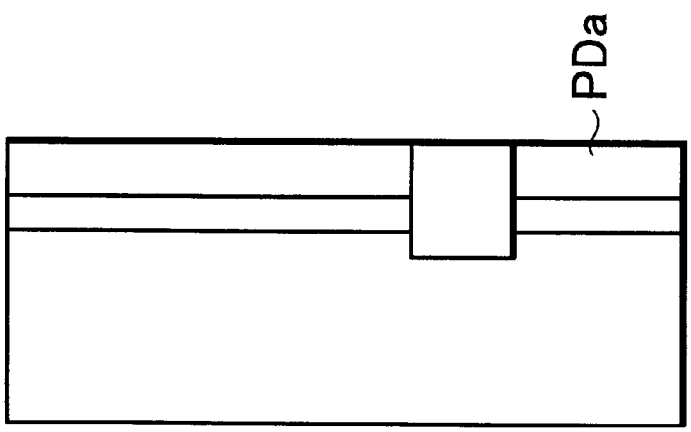

SEMICONDUCTOR LASER APPARATUS, LASER COUPLER, DATA REPRODUCTION APPARATUS, DATA RECORDING APPARATUS AND PRODUCTION METHOD OF SEMICONDUCTOR LASER APPARATUS

RELATED APPLICATION DATA

The present application claims priority to Japanese Application No. P2000-053764 filed Feb. 29, 2000, which application is incorporated herein by reference to the extent permitted by law.

BACKGROUND OF THE INVENTION

1. Field of the Invention

The present invention relates to a semiconductor laser apparatus comprising cavities in correspondent with a plurality of light emitting units fabricated on the same substrate, and a laser coupler, a data reproduction apparatus and a data recording apparatus having the semiconductor laser apparatus, and a production method of the semiconductor laser apparatus.

2. Description of the Related Art

In recent years, an apparatus capable of recording and reproducing of a plurality of media such as CD (compact disk) and DVD (digital versatile disk) has been developed. When single apparatus is used to record/reproduce a plural types of media, the apparatus is required to have a system construction satisfying all the standards of media types included in the system. For example, at least two laser light emitting devices with different wavelengths have to be equipped in the same apparatus so as to perform recording/reproducing of both the CD and the DVD, that use laser lights with different wavelengths.

The device emitting laser lights with two different wavelengths may be realized by combining separate semiconductor laser devices emitting the two wavelengths and respective optical systems for the separate semiconductor laser devices. However, the combination of the separate devices and the optical systems may causes increase of a number of parts and a total cost of the apparatus, and prevent reduction of the apparatus size.

To resolve such disadvantages, a monolithic type semiconductor laser device had been developed. The monolithic type semiconductor laser device (so called two wavelength laser) has two active layers grown on the same substrate separately for emitting different wavelength lasers. FIGS. 10A and 10B are explanatory schematics illustrating a monolithic type semiconductor laser device. FIG. 10A is a plan view of the monolithic type semiconductor laser device. FIG. 10B is a cross sectional view showing a cross section taken on line X–X' in FIG. 10A.

The semiconductor laser device may be produced, for example, by fabricating a n-GaAs buffer layer 2a on a substrate 1 consisting of n-GaAs, and, a laser diode A emitting 780 nm band wavelength laser light and a laser diode B emitting 650 nm band wavelength laser light on the n-GaAs buffer layer 2a. A separation between light emitting parts of the laser diode A and the laser diode B is less than 200 μm. For example, the separation may be set to less than 100 μm in many cases.

In the monolithic type semiconductor laser with the configuration described above, it is possible to keep a separation between the two laser lights into a smaller value with high precession since the active layers and the clad layers capable of emitting different wavelength laser lights are fabricated separately on the same substrate. Accordingly, an optical system at a subsequent stage may be shared, and it becomes possible to reduce a number of parts, a total cost of the apparatus, and a size of the apparatus.

SUMMARY OF THE INVENTION

However, there are some drawbacks in the semiconductor laser devices or apparatus described above despite of its advantages such as having a capability of sharing the same optical system in the subsequent stage and setting a smaller separation between the two laser lights with high precession, that are due to the fact that the laser diodes emitting different wavelength laser lights are fabricated separately on the same substrate. Namely, some of requirements from a system, which may be data reproducing/recoding apparatus using the multiple laser lights, may not be satisfied since cavity lengths in the semiconductor laser are fabricated the same.

For example, in the data reproducing/recording apparatus, there are requirements to optimize data reproduction/recording at 780 nm band laser light for the CD and at 650 nm band laser light for the DVD. However, all the cavity lengths are fabricated the same by cleavage since the both laser diodes are fabricated on the same substrate in the monolithic type semiconductor laser device described above. Accordingly, it is difficult to satisfy all the requirements for reproducing/recording of media using multiple wavelength laser lights.

Furthermore, a cavity of a laser diode may be fabricated to a longer length than necessary since a cavity length of one laser diode is determined by a cavity length of the other laser diode. Accordingly, a current consumption of the one laser diode is increased unnecessarily.

The invention was carried out to resolves such drawbacks. That is, in accordance with an embodiment of the present invention, there is provided a semiconductor laser apparatus comprising a plurality of cavities corresponding to a plurality of light emitting units on a substrate respectively, wherein the plurality of cavities have different cavity lengths.

According to the embodiment of the present invention, the semiconductor laser apparatus, comprising the cavities corresponding to the light emitting units on the same substrate and having different cavity lengths, may be optimized with requirements of a system such as data reproducing/recording apparatus employing the semiconductor laser apparatus therein since the cavity cavity lengths may be individually adjusted to different from one another.

Alternatively, the plurality of cavities in accordance with the present invention may be fabricated to have cavity lengths all less than a length of said substrate. Furthermore, one of the cavities in accordance with the present invention may comprise a three-element type compound semiconductor, and another of the cavities may comprise a four-element type compound semiconductor.

BRIEF DESCRIPTION OF THE DRAWINGS

The invention is herein described, by way of example only, with reference to the accompanying drawings, wherein:

FIG. 7A is a schematic cross sectional view illustrating a another embodiment of the present invention;

FIG. 7B is a schematic plane view illustrating the embodiment shown in FIG. 7A;

DESCRIPTION OF THE PREFERRED EMBODIMENTS

Figure 1:
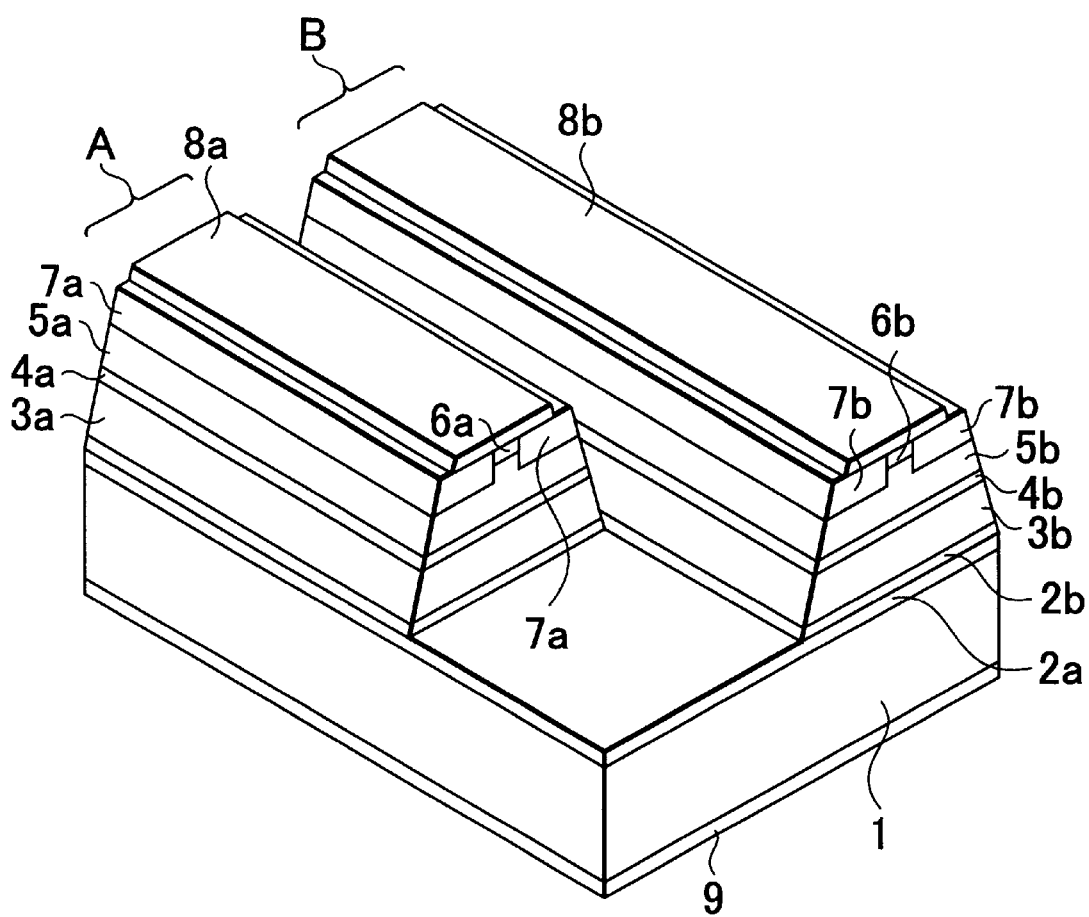
FIG. 1 is a schematic perspective view illustrating a semiconductor laser apparatus in accordance with an embodiment of the present invention.

FIG. 1 is a schematic perspective view illustrating a semiconductor laser device in accordance with an embodiment of the present invention. The semiconductor laser device of the present embodiment is so-called a monolithic type semiconductor laser device having cavities (active layers 4a, 4b) corresponding to a plurality of light emitting units fabricated on the same substrate 1, and particularly characterized by having different cavity lengths for the cavities.

In the semiconductor laser shown in FIG. 1, a laser diode A emitting laser light of 780 nm band oscillation wavelength for the CD and a laser diode B emitting laser light of 650 nm band oscillation wavelength for the DVD are fabricated on the same substrate 1.

The substrate 1 may consist of, for example, n-GaAs. In the laser diode A part, a n-clad layer 3a comprising n-AlGaAs, an active layer 4a comprising GaAs, a p-clad layer 5a comprising p-AlGaAs and a cap layer 6a comprising p-GaAs are fabricated layer by layer on a n-GaAs buffer layer 2a. High resistance layers 7a are fabricated on the p-clad layer 5a at both sides in longitudinal direction leaving a striped gap between them, whereby realizing a gain guide type current stricture structure. On the top of the cap layer 6a, a p-type electrode 8a comprising Ti/Pt/Au multiple layers is fabricated. An n-type electrode 9 comprising AuGe/Ni/Au multiple layers is fabricated on the bottom side of the substrate 1. The n-type electrode 9 is shared for both the laser diode A part and the laser diode B part.

In the laser diode B part, a n-InGaP buffer layer 2b, a n-clad layer 3b comprising n-AlGaInP, an active layer 4b comprising GaInP, a p-clad layer 5b comprising p-AlGaInP and a cap layer 6b comprising p-GaAs are fabricated layer by layer on the n-GaAs buffer layer 2a. High resistance layers 7b are fabricated on the p-clad layer 5b at both sides in a longitudinal direction leaving a striped gap between them, whereby realizing a gain guide type current stricture structure. On the top of the cap layer 6b, a p-type electrode 8b comprising Ti/Pt/Au multiple layers is fabricated.

Among the laser diodes A and B, the laser diode B for the DVD has a cavity (the active layer 4b) with a length (cavity length) determined by cleavage at the both edges. A length (cavity length) of a cavity (the active layer 4a) of the laser diode A for the CD is determined by removing at one of its edges with using a dry process such as a reactive ion etching process (RIE). Accordingly, the cavity length of the laser diode B for the DVD may be adjusted to a suitable one for a DVD reproduction/recording apparatus (system) as well as the cavity length of the laser diode A for the CD may be adjusted to a suitable one for a CD reproduction/recording apparatus (system). The cavity length of the laser diode A can be independently determined without any restrain of the cavity length of the laser diode B.

Figure 2A:
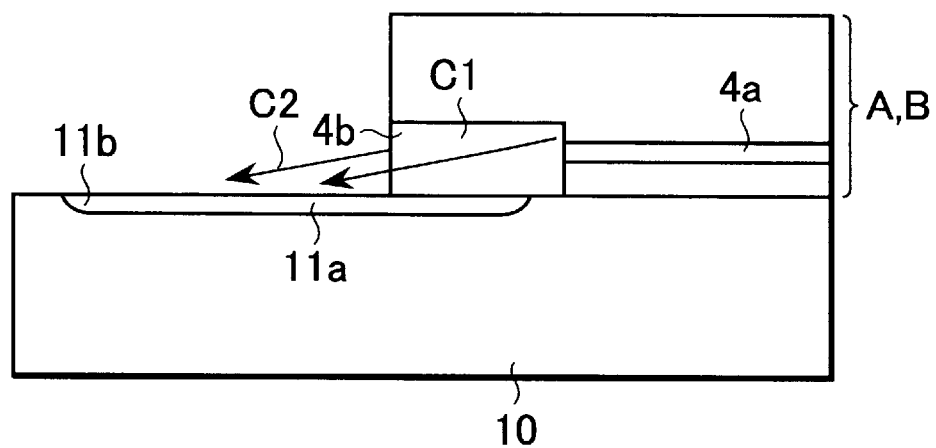
FIG. 2A is a side view illustrating an example wherein the semiconductor laser apparatus in accordance with the embodiment is mounted on a photo detector substrate.
Figure 2B:
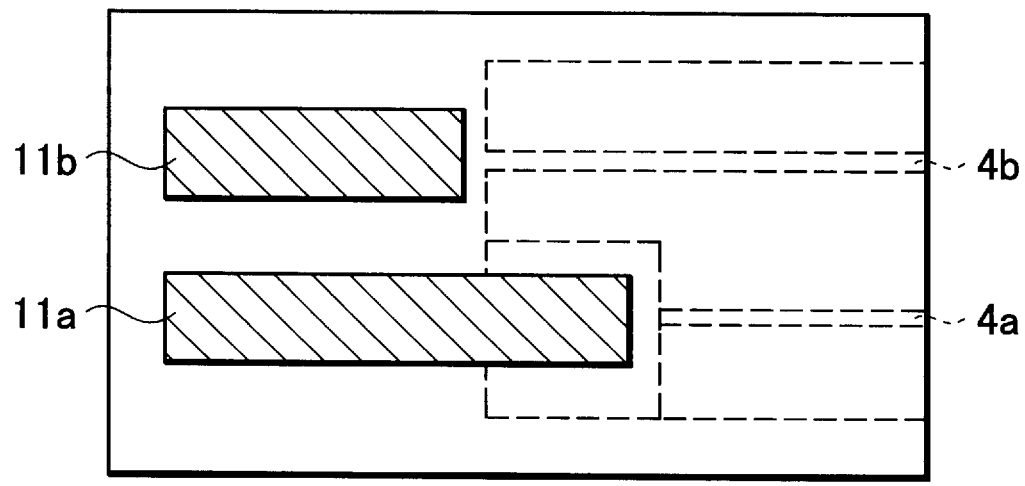
FIG. 2B is a plane view illustrating an example wherein the semiconductor laser apparatus in accordance with the embodiment is mounted on a photo detector substrate.

FIGS. 2A and 2B are a side view and a plane view respectively showing an example of a photo detector substrate mounted with a semiconductor laser device in accordance with the present embodiment. In this example, the semiconductor laser device of the present embodiment is mounted on the photo detector substrate 10 with reversing the bottom side of the semiconductor laser device up. As described above, the cavity lengths of two laser diodes A and B are different in the semiconductor laser device of the present embodiment. Accordingly, one side of both laser diodes A and B are aligned while the other side are not whereby creating a step construction. In the present example, laser lights C1, C2 emitted from end faces at the side with the step construction are received at photo detectors 11a, 11b respectively. These photo detectors 11a, 11b are used, for example, to monitor laser light intensity.

The semiconductor laser device of the present invention enables to prevent interference of the laser lights C1 and C2 since the semiconductor laser device has the light emitting edge with the step construction so as to realize different emitting positions for the laser lights C1 and C2. A part of emitted laser light C1 spreads toward an outside wall of the laser diode B, and reflected thereon. Accordingly, the laser light C1 is prevented to reach the photo detector 11b for receiving the laser light C2. In the present example, the laser lights C1 and C2 are accurately received by the photo detectors 11a and 11b, and whereby a precise monitoring is realized.

Figure 3A:
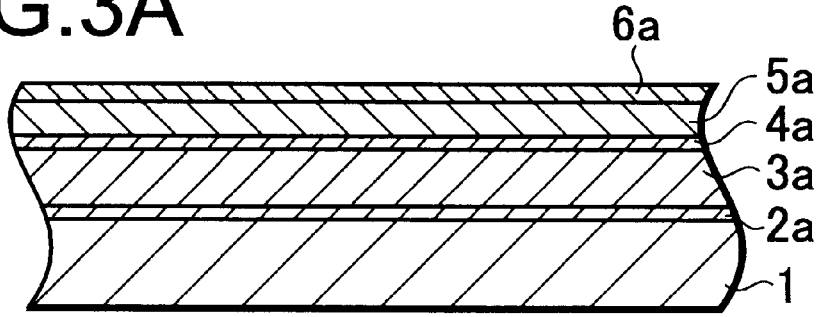
FIG. 3A is a cross sectional view illustrating a step of a production method of a semiconductor laser apparatus in accordance with an embodiment of the present invention.

A Production method of the semiconductor laser device in accordance with an embodiment of the present invention will now be explained. Referring to FIG. 3A, a buffer layer 2a, a n-clad layer 3a, an active layer 4a, a p-clad layer 5a and a cap layer 6a are fabricated on a substrate 1 layer by layer with using an epitaxial growth method such as a metal organic vapor epitaxial growth method (MOVPE). The buffer layer 2a may consist of n-GaAs, for example. The n-clad layer 3a may consist of n-AlGaAs, for example. The active layer 4a may be constructed to have a multiple quantum well structure having GaAs layers, for example. The p-clad layer 5a may consist of p-AlGaAs, for example. The cap layer 6a may consist of p-GaAS, for example. The substrate 1 may consist of, for example, n-GaAs.

Figure 3B:
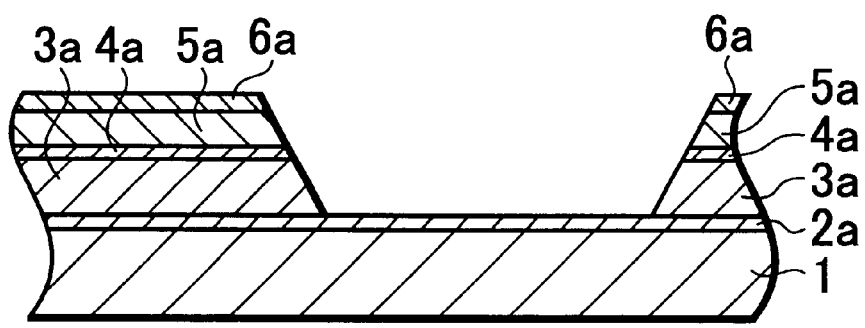
FIG. 3B is a cross sectional view illustrating a step of the production method of a semiconductor laser apparatus in accordance with an embodiment of the present invention.

Next, as shown in FIG. 3B, a wet etching process such as non-selective type etching using sulfuric acid type solution and selective etching process for AlGaAs using hydrofluoric acid type solution are carried out after a part to become the laser diode A is covered by a resist (not shown in the figure) to be protected. The etching process removes all the layers fabricated above the n-clad layer 3a at a part to be the laser diode B.

Figure 3C:
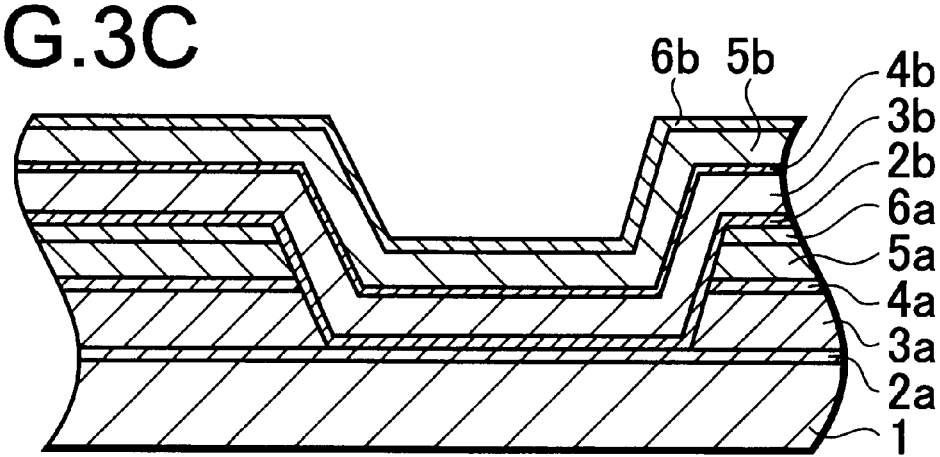
FIG. 3C is a cross sectional view illustrating a step of the production method of a semiconductor laser apparatus in accordance with an embodiment of the present invention.

Next, as shown in FIG. 3C, a buffer layer 2b consisting of, for example, n-InGaP is fabricated on the buffer layer 2a of the laser diode B part and on the cap layer 6a at a region beside the laser diode B part with using an epitaxial growth method such as the metal organic vapor epitaxial growth method. On the etched substrate, an n-clad layer 3b, an active layer 4b, a p-clad layer 5b and a cap layer 6b are fabricated layer by layer. The n-clad layer 3b may consist of n-AlGaInP, for example. The active layer 4b may be constructed to have a multiple quantum well structure having GaInP layers, for example. The p-clad layer 5b may consist of p-AlGaInP, for example.

Figure 4A:
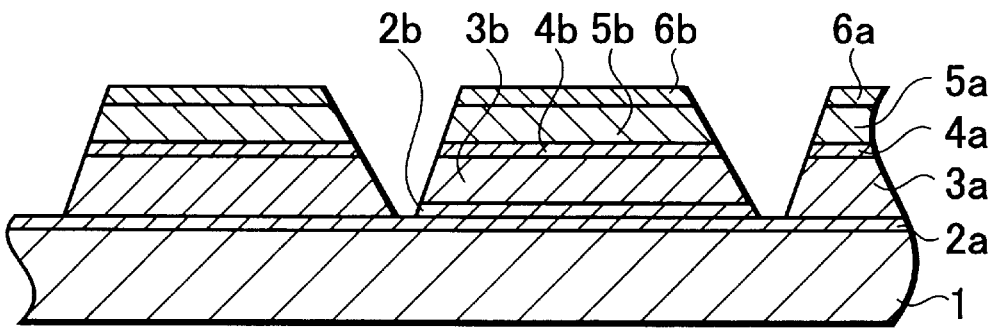
FIG. 4A is a cross sectional view illustrating a step of the production method of a semiconductor laser apparatus in accordance with an embodiment of the present invention.

Next, as shown in FIG. 4a, a wet etching process with using such as sulfuric acid type solution and selective etching process for AlGaAs using hydrofluoric acid type solution may be carried out to remove a part of the cap layer 6b besides the laser diode B part after a part to become the laser diode b is protected by a resist (not shown in the figure). Furthermore, another wet etching process using such as phosphoric acid/hydrochloric acid type solution is carried out to remove the p-clad layer 5b, the active layer 4b, the n-clad layer 3b and the buffer layer 2b at a region besides the laser diode B part. Furthermore, another wet etching process using such as hydrochloric acid type solution is carried out to fabricate a trench reaching up to the buffer layer 2a whereby the laser diodes are separated.

Figure 4B:
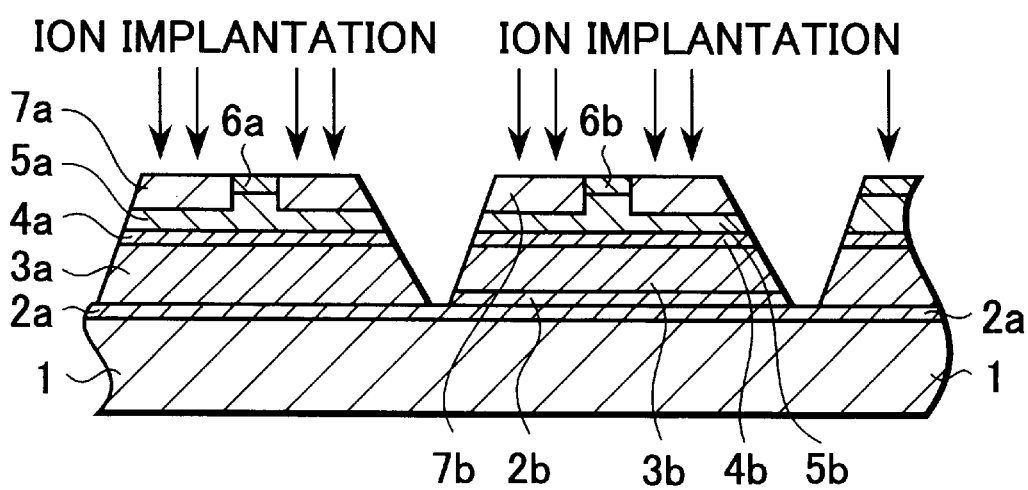
FIG. 4B is a cross sectional view illustrating a step of the production method of a semiconductor laser apparatus in accordance with an embodiment of the present invention.

Next, as shown in FIG. 4b, impurities are ion-implanted at surfaces of the p-clad layers 5a, 5b after protecting a part to become a current injection region of each laser diode with resist (not shown in the figure). Accordingly, the high resistance layers 7a, 7b are fabricated at the region exposed for the ion-implantation, and the gain guide type current stricture construction is realized.

Figure 5A:
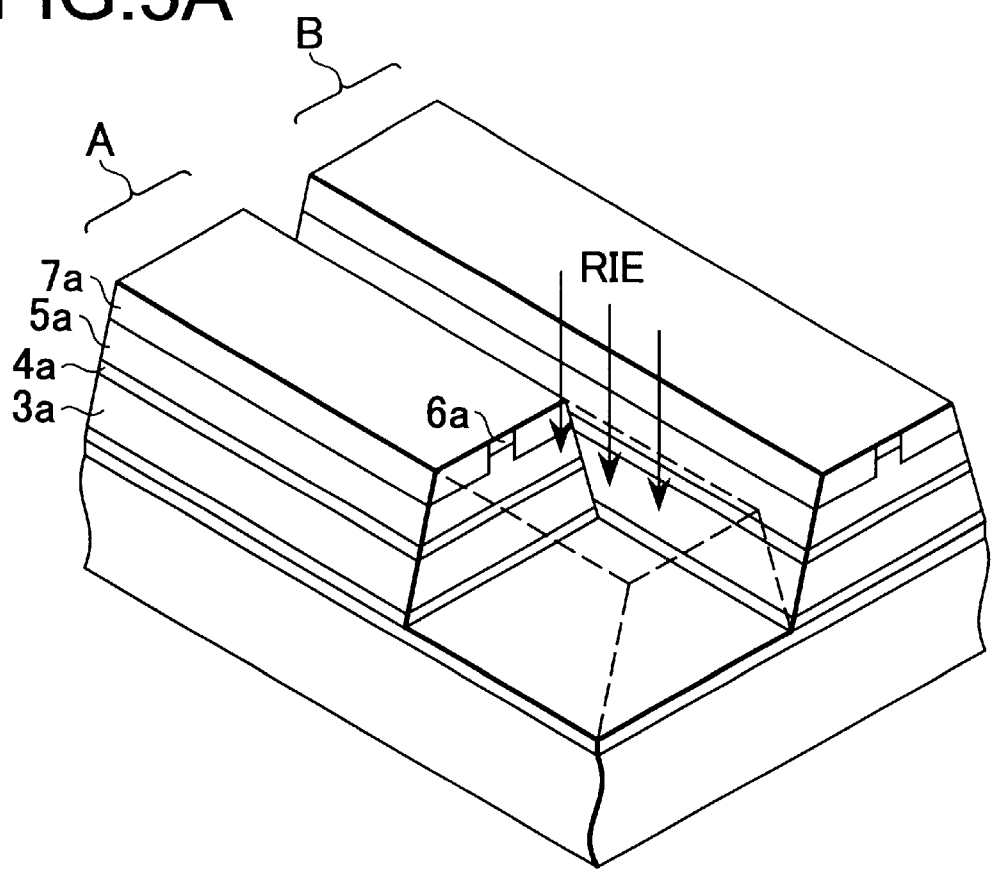
FIG. 5A is a perspective view illustrating a step of the production method of a semiconductor laser apparatus in accordance with an embodiment of the present invention.

Next, as shown in FIG. 5A, the high resistance layer 7a, the cap layer 6a, the p-clad layer 5a, the active layer 4a and the n-clad layer 3a disposed at a part at one end of the laser diode A, which is used for the CD among the laser diodes A and B in the present example, are removed by a dry process such as a reactive ion etching (RIE) process. Accordingly, the cavity length of the laser diode A may be optimized. Alternatively, some of the part of the n-clad layer 3a may be left in another embodiment.

Figure 5B:
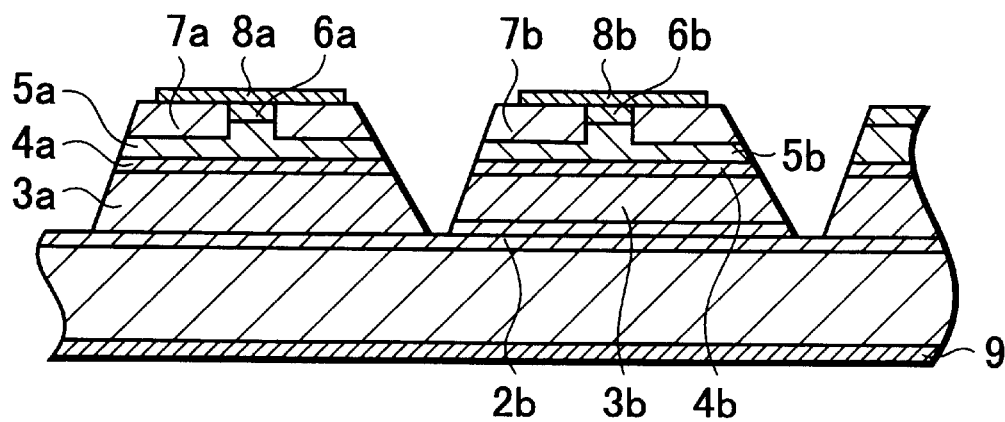
FIG. 5B is a cross sectional view illustrating a step of the production method of a semiconductor laser apparatus in accordance with an embodiment of the present invention.

Next, as shown in FIG. 5B, p-type electrodes 8a, 8b are fabricated on the laser diodes A, B respectively by, for example, depositing multiple layers of Ti/Pt/Au on the cap layers 6a, 6b using a sputtering process. Furthermore, an n-type electrode 9 is fabricated on a side of the substrate 1 other than the side wherein the laser diodes A and B are fabricated.

After performing palletizing process, the semiconductor laser device as shown in FIG. 1 with the laser diodes A and B having different cavity lengths fabricated on the same substrate 1 is constructed. it is preferred to adhere dielectric films corresponding to oscillation wavelengths respectively at the end faces of the laser diodes A and B.

Figure 6:
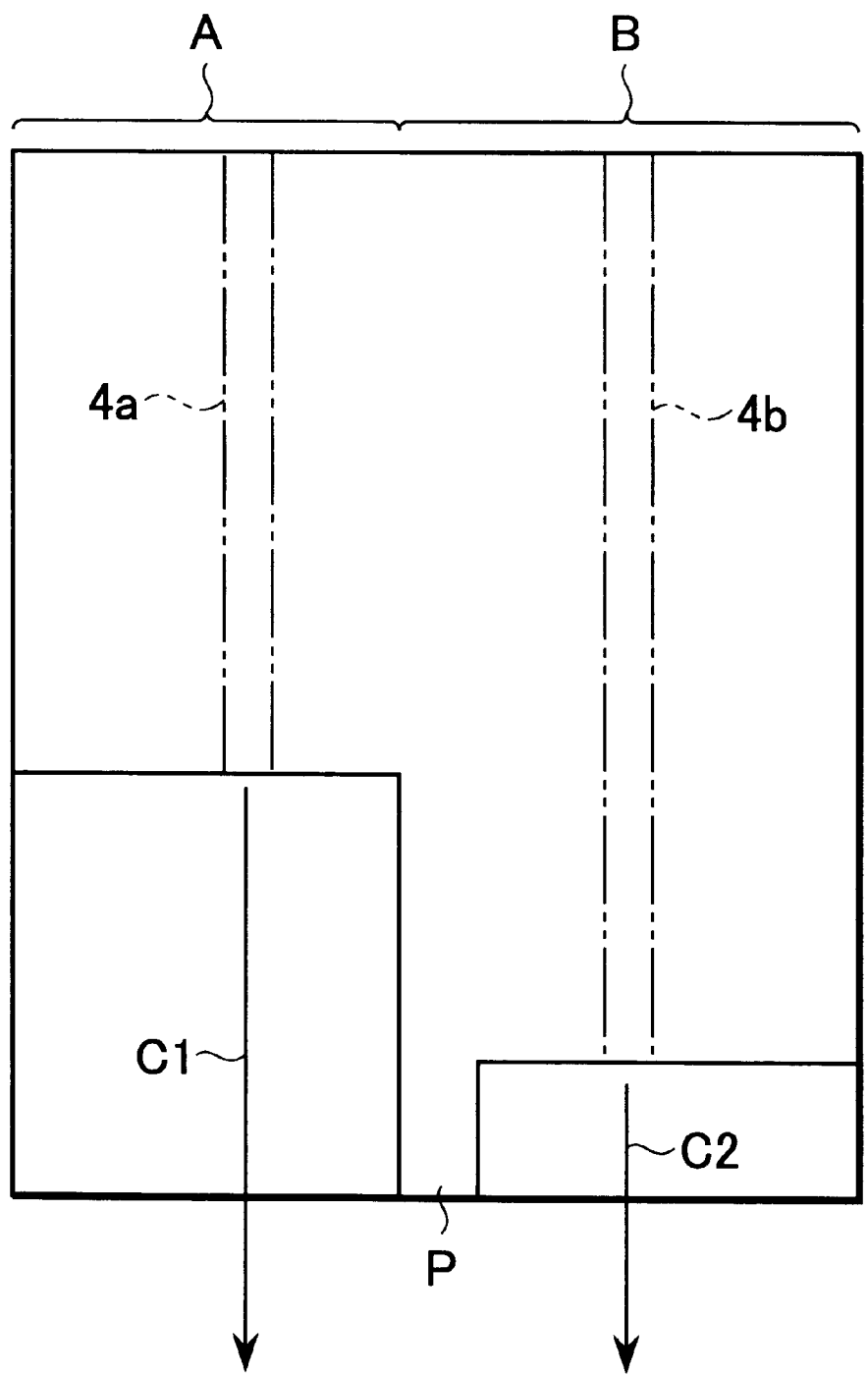
FIG. 6 is a schematic plane view illustrating another embodiment of the present invention.

Another example of the present embodiment will now be explained. FIG. 6 is a schematic view (part 1) illustrating the instant example. According to a semiconductor laser of the present example, the cavity lengths of both the laser diodes A and B are optimized by removing a part of the end portion of one of the laser diodes A and B with using a dry process such as the RIE process as well as a barrier P is provided in between the laser diodes A and B by leaving a part remained by the dry process.

The laser lights C1 and C2 emitted from the end faces of the laser diodes A and B are completely separated by the barrier P. For example, when the laser lights C1 and C2 emitted from the end faces are radiated and received by photo detectors for intensity monitoring, a part of the laser light C1 emitted from the end face of the laser diode A, which is spreading toward a side of the laser diode B, is reflected by the barrier P. On the other hand, a part of the laser light C2 emitted from the end face of the laser diode B, which is spreading toward a side of the laser diode A, is reflected by the barrier P.

Accordingly, the laser lights C1 and C2 are completely separated by the barrier P, and received by the photo detectors without having any interference in between, whereby precise monitoring is realized. Furthermore, it enables simultaneous monitoring of the both laser lights C1 and C2 since there is no interference among the laser lights C1 and C2.

Furthermore, when the semiconductor laser device of the instant example is mounted on the photo detector substrate with reversing the substrate side of the semiconductor laser device up as shown in FIG. 2A, areas around emission portions of the laser lights C1 and C2 emitted from the laser diodes A and B are surrounded by the photo detector substrate, the substrate of the semiconductor laser device and the barrier P, shielded by three planes. Accordingly, the laser lights C1 and C2 are reflected by the surrounding surfaces and received efficiently by the photo detectors, and reception sensitivities of the photo detectors may be increased.

FIGS. 7A and 7B are a schematic side and plane views (part 2) of another example of the present embodiment. In the semiconductor laser device of the instant example, one of the laser diode parts A and B (the laser diode A for the CD use in this example) is fabricated to remove a middle part by the dry process (for example, by RIE process), and one of parts remained is used as a photo detector PDa for the laser diode A. In this example, a cavity length of the laser diode A is designated as L1 in the figures.

In the instant example, the photo detector PDa has the same construction as that of the laser diode A, and may be used as a light reception element for monitoring light intensity. Accordingly, both the laser diode A and the photo detector PDa may be fabricated at the same production step, and separate production steps are not required. Furthermore, the cavity lengths of the laser diodes A and B may be optimized in the same way as described in the previous example.

Furthermore, it is possible to apply coating on an end face of the laser diode A at a side facing the photo detector PDa with using, for example, a slant vacuum evaporation even when a middle part of the laser diode A part is removed (etched) as in the instant example.

Figure 8:
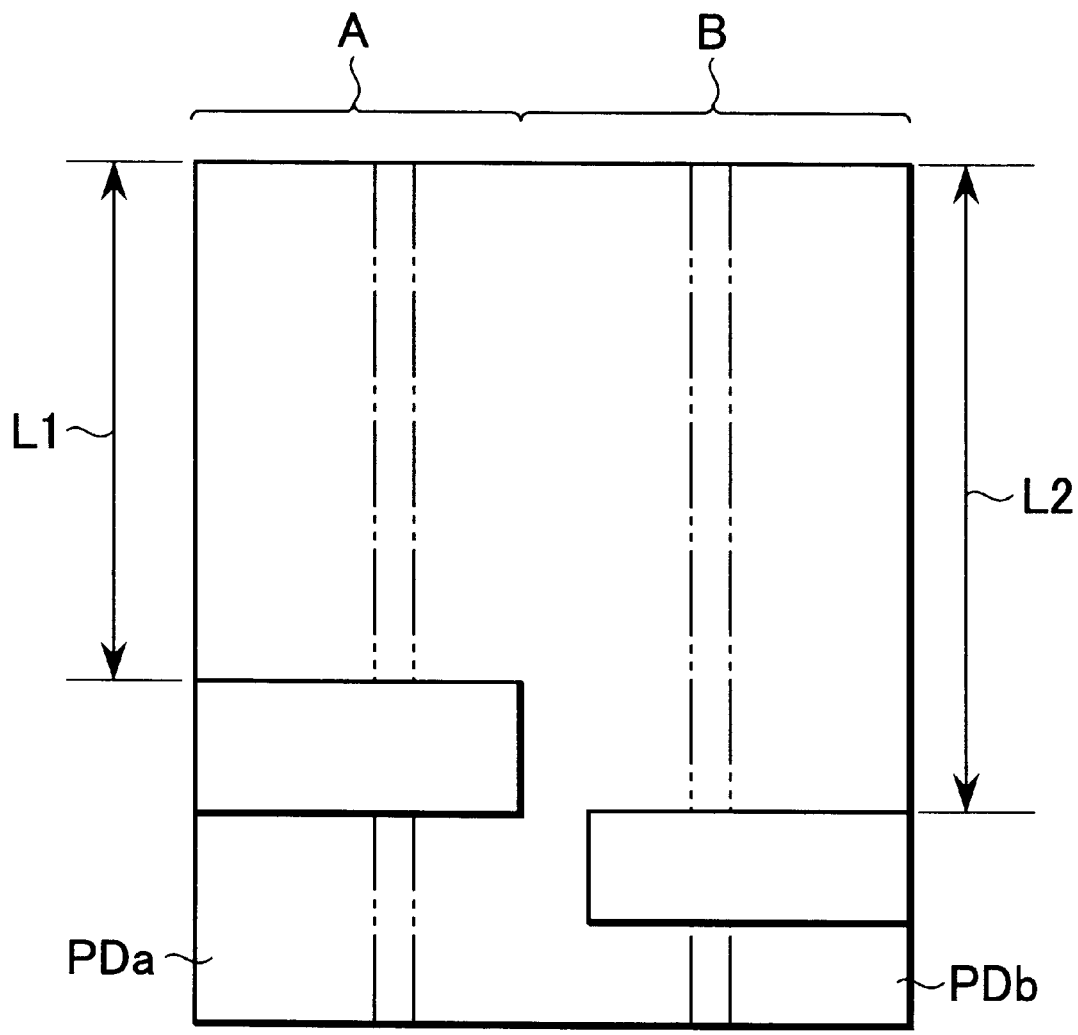
FIG. 8 is a schematic plane view illustrating another embodiment of the present invention.

FIG. 8 is a schematic view (part 3) illustrating another example of the present embodiment. In the semiconductor laser device of the instant example, middle parts of both the laser diode A part and the laser diode B part are removed by the dry process such as the RIE process. When the middle part of the laser diode A part is removed, some parts on both edges of the substrate are left remained, and one of the remaining parts is used as a photo detector PDa for the laser diode A. Similarly, when the middle part of the laser diode B part is removed, some parts on both edges of the substrate are left remained, and one of the remaining parts is used as a photo detector PDb for the laser diode B. The cavity length of the laser diode A, B is designated as L1, L2 in FIG. 8.

In the instant example, the photo detector PDa has the same construction as that of the laser diode A, and the photo detector PDb has the same construction as that of the laser diode B. Both photo detectors may be used as a light reception element for monitoring light intensity. Accordingly, each pair of the laser diode A and the photo detector PDa and the laser diode B and the photo detector PDb may be fabricated at the same production step, and separate production steps are not required. Furthermore, the cavity lengths of the laser diodes A and B may be optimized in the same way as described in the previous example.

Figure 9A:
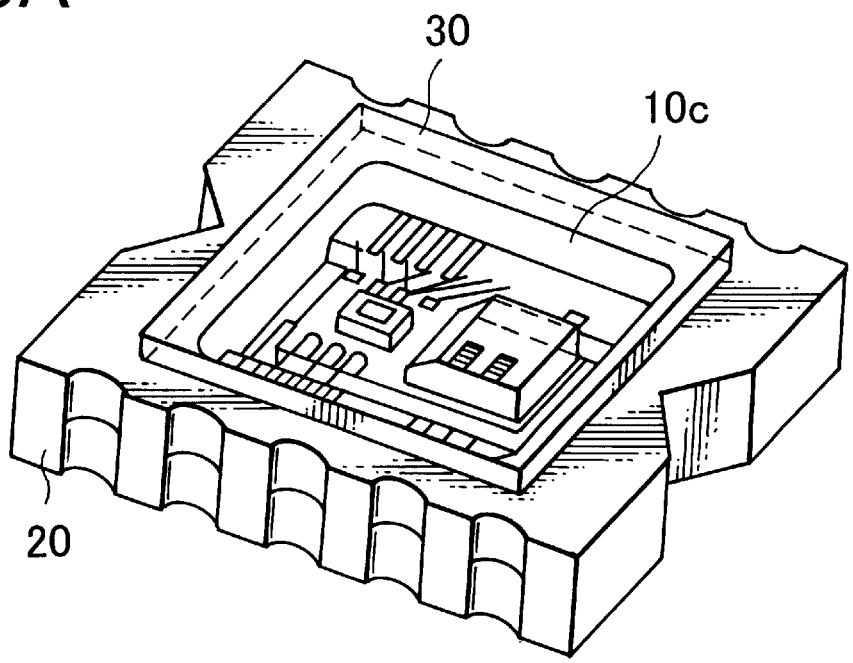
FIG. 9A is a perspective view illustrating a laser coupler in accordance with an embodiment of the present invention.
Figure 9B:
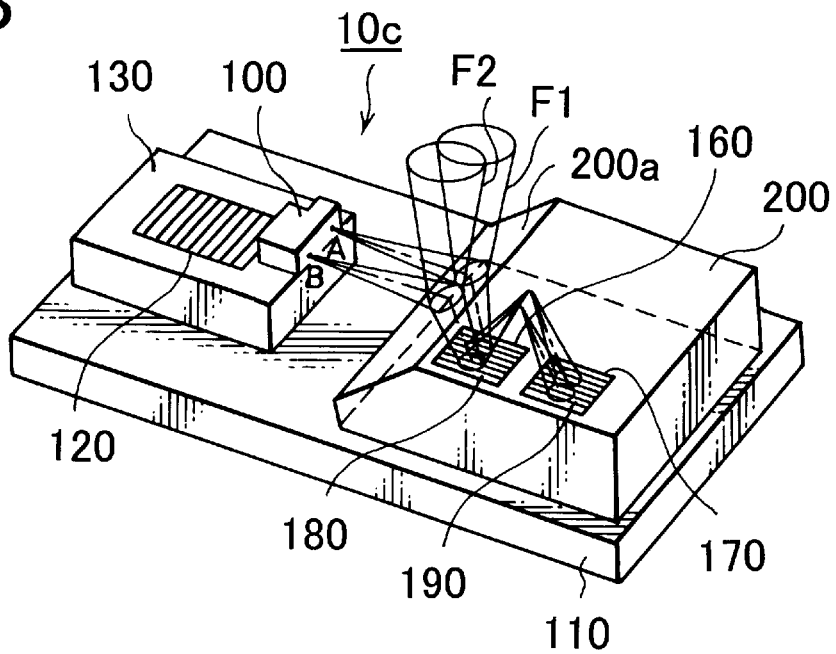
FIG. 9B is a perspective view illustrating a laser coupler in accordance with another embodiment of the present invention.
Figure 10A:
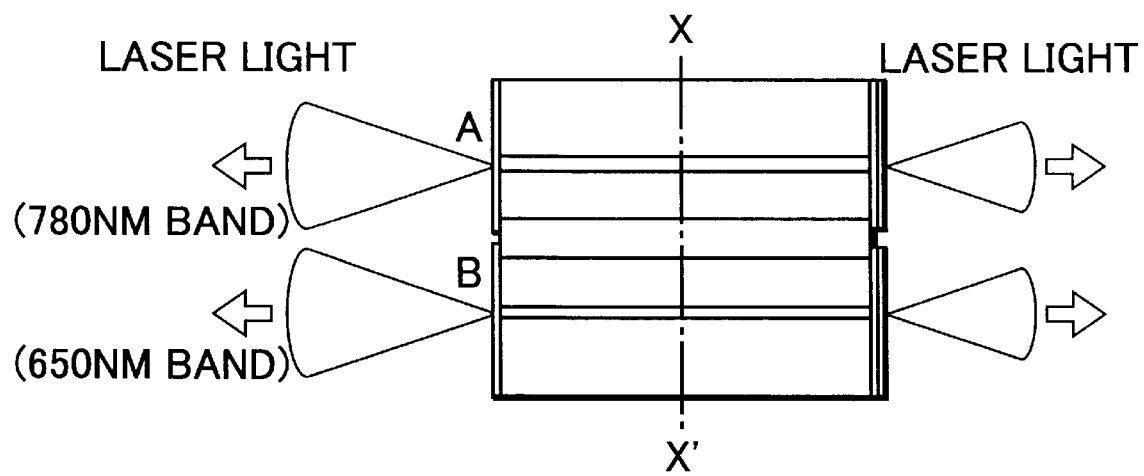
FIG. 10A is a schematic plane view illustrating a semiconductor laser of the related art.
Figure 10B:
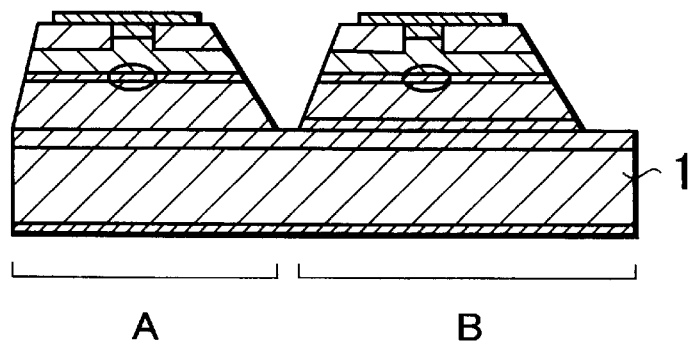
FIG. 10B is a schematic cross sectional view illustrating the semiconductor laser shown in FIG. 10A.

An example of a laser coupler employing the semiconductor laser device in accordance with an embodiment of the present invention will now be explained. FIG. 9A is a schematic overview of a package of the laser coupler of the instant example, and FIG. 9B is a schematic overview of the laser coupler. The laser coupler may be used, as in one of the major applications, for an apparatus reproducing/recording data on an optical storage medium such as a CD and a DVD by radiating light thereon. In the instant example, the semiconductor laser device 100 in accordance with the present embodiment is mounted on a semiconductor block 130 in which a PIN photo diode 120 of a laser coupler 10c is fabricated.

The laser coupler 10c is mounted on a concaved portion of a first package member 20, and shielded by a second package member 30. The second package member 30 is transparent and may be made of glass material. For example, the semiconductor block 130, in which the PIN photo diode 120 is fabricated as the light reception element, is disposed on an integrated circuit substrate 110 which may be a substrate being cut-out from a monocrystal silicon. Furthermore, a monolithic type semiconductor laser device 100, in which the laser diodes A and B are fabricated on a common substrate as the light emission element, is disposed on the semiconductor block 130.

In the instant example, first photo diodes 160, 170 and second photo diodes 180, 190 are fabricated on the integrated circuit board 110, and a prism 200 is mounted on the first photo diodes 160, 170 and the second photo diodes 180, 190 so as to have a predetermined separation distance from the laser diodes A and B.

According to the laser coupler 10c of the instant example, a part of a laser light F1 emitted from the laser diode A is refracted at a spectral plane 200a of the prism 200 and radiated out along a predetermined emission direction through a radiation window fabricated at the second package member 30 to irradiate a target object such as an optical disk (for example, the CD) via optical elements (not shown in the figure) comprising such as a reflection mirror and an object lens.

A reflection light from the target object propagates along the reverse direction of the incident light to the target object, and returns to the spectral plane 200a of the prism 200 along the reverse direction of the emitting direction out from the laser coupler 10c. The returning light is focused at the upper surface plane of the prism 200, and falls onto the photo diode 160 at the upstream side and the photo diode 170 at the downstream side, both being disposed at the lower surface plane of the prism 200 and fabricated on the integrated circuit board 110.

Similarly, a part of a laser light F2 emitted from the laser diode B is refracted at a spectral plane 200a of the prism 200 and radiated out along a predetermined emission direction through a radiation window fabricated at the second package member 30 to irradiate a target object such as an optical disk (for example, the DVD) via optical elements (not shown in the figure) comprising such as a reflection mirror and an object lens.

A reflection light from the target object propagates along the reverse direction of the incident light to the target object, and returns to the spectral plane 200a of the prism 200 along the reverse direction of the emitting direction out from the laser coupler 10c. The returning light is focused at the upper surface plane of the prism 200, and falls onto the photo diode 180 at the upstream side and the photo diode 190 at the downstream side, both being disposed at the lower surface plane of the prism 200 and fabricated on the integrated circuit board 110.

The PIN diode 120 fabricated on the semiconductor block 130 may be divided into two regions for detecting laser lights emitted from the laser diodes A and B toward the rear direction. Results of the PIN diode 120 detection are used to measure intensities of the laser lights, and to perform an APC (auto power control) control to control drive currents of the laser diodes A and B so as to keep the intensities of the laser lights at constant values.

According to the laser couple 10c employing the monolithic type semiconductor laser 100 in accordance with the present embodiment, a number of parts required for a optical pickup apparatus of the optical disk system using different wavelengths, for example, for the CD and the DVD. Accordingly, the laser coupler 10c enables simplification of an optical system structure, and to provide easier assembling capability and reduce production costs. Furthermore, the semiconductor laser 100 in accordance with the present embodiment enables precise reproducing/recording operation since the cavity lengths of two laser diodes A and B are optimized for corresponding CD optical disk system and DVD optical disk system, respectively.

In all the embodiments described above, the semiconductor laser device emitting two laser lights is described as the example. Alternatively, the present invention may also be applicable to a semiconductor laser emitting more than three laser lights. Furthermore, the laser lights emitted from the semiconductor laser device in the embodiments described above. Alternatively, the laser lights emitted from the semiconductor laser device may have the same wavelength. Furthermore, the CD and the DVD are used as examples of the optical storage medium in the embodiments described above. Alternatively, other types of medium such as CD-R/RW and MD (mini disk) may be used as well in the present invention.

According to the present invention, the following effects may be achieved. The semiconductor laser with a plurality of light emitting units fabricated on the same substrate in accordance with the present invention enables optimization of every cavity length of the cavities corresponding to the plurality of the light emitting units, and simultaneously satisfying individual requirements of data reproducing/recording apparatuses using respective laser lights. Furthermore, the present invention enables to eliminate such a case wherein a cavity length of one laser diode have to be set a longer than necessary since a cavity length of the one laser diode is determined by a cavity length of the other laser diode, and to prevent increase of unnecessary current consumption. Furthermore, according to the present invention, the reproducing/recording performances for each of media in correspondent with each of the emitted laser lights may be promoted in the semiconductor laser device while advancing cost-cutting and downsizing of data reproducing/recording apparatus using the semiconductor laser.

What is claimed is:

1. A semiconductor laser apparatus having a plurality of cavities corresponding to a plurality of light emitting units disposed on a substrate, wherein:
   at least one of said plurality of cavities has a cavity length different from another of said plurality of cavities, and
   said plurality of cavities is fabricated to have cavity lengths all less than a length of said substrate.

2. A semiconductor laser apparatus according to claim 1, wherein:
   said plurality of cavities is fabricated to have cavity lengths corresponding to oscillation wavelengths of lights emitted from respective cavities.

3. A semiconductor laser apparatus according to claim 1, further comprising:
   a barrier member disposed in between neighboring cavities.

4. A semiconductor laser apparatus according to claim 1, wherein:
   one of said plurality of cavities comprises a three-element type compound semiconductor, and another of the plurality of cavities comprises a four-element type compound semiconductor.

5. A semiconductor laser apparatus according to claim 1, wherein:
   one of said plurality of cavities emits laser light with a 780 nm band oscillation wavelength, and another of said plurality of cavities emits laser light with a 650 nm band oscillation wavelength.

6. A semiconductor laser apparatus according to claim 1, wherein:
   one of said plurality of cavities is provided to be used for CD (compact disk), and another of said plurality of cavities is provided to be used for DVD (digital video disk).

7. A semiconductor laser apparatus according to claim 1, wherein:
   a first side of each of said plurality of cavities is cleaved; and
   a second side opposite the first side of each of said plurality of cavities is etched.

8. A laser coupler apparatus having a semiconductor laser apparatus, wherein:
   said semiconductor laser apparatus comprises a plurality of cavities corresponding to a plurality of light emitting units disposed on a substrate,
   at least one of said plurality of cavities has a cavity length different from another of said plurality of cavities, and
   said plurality of cavities is fabricated to have cavity lengths all less than a length of said substrate.

9. A data reproducing apparatus having a semiconductor laser apparatus, wherein:
   said semiconductor laser apparatus comprises a plurality of cavities corresponding to a plurality of light emitting units disposed on a substrate,
   at least one of said plurality of cavities has a cavity length different from another of said plurality of cavities, and
   said plurality of cavities is fabricated to have cavity lengths all less than a length of said substrate.

10. A data recording apparatus having a semiconductor laser apparatus, wherein:
    said semiconductor laser apparatus comprises a plurality of cavities corresponding to a plurality of light emitting units disposed on a substrate,
    at least one of said plurality of cavities has a cavity length different from another of said plurality of cavities, and
    said plurality of cavities is fabricated to have cavity lengths all less than a length of said substrate.

11. A semiconductor laser apparatus having a plurality of cavities corresponding to a plurality of light emitting units disposed on a substrate, wherein:
    at least one of said plurality of cavities has a cavity length different from another of said plurality of cavities,
    said plurality of cavities is fabricated to have cavity lengths all less than a length of said substrate, and
    a barrier member is disposed in between neighboring cavities, the baffler member having a length longer than the cavity lengths.

12. A semiconductor laser apparatus according to claim 11, wherein:
    said plurality of cavities is fabricated to have cavity lengths corresponding to oscillation wavelengths of lights emitted from respective cavities.

13. A semiconductor laser apparatus according to claim 11, wherein:
    one of said plurality of cavities comprises a three-element type compound semiconductor, and another of the plurality of cavities comprises a four-element type compound semiconductor.

14. A semiconductor laser apparatus according to claim 11, wherein:
    one of said plurality of cavities emits laser light with a 780 nm band oscillation wavelength, and another of said plurality of cavities emits laser light with a 650 nm band oscillation wavelength.

15. A semiconductor laser apparatus according to claim 11, wherein:
    one of said plurality of cavities is provided to be used for CD (compact disk), and another of said plurality of cavities is provided to be used for DCD (digital video disk).

16. A semiconductor laser apparatus according to claim 11, wherein:
    a first side of each of said plurality of cavities is cleaved; and
    a second side opposite the first side of at least one of said plurality of cavities is etched.

17. A semiconductor laser apparatus having a plurality of cavities corresponding to a plurality of light emitting units disposed on a substrate, wherein:
    at least one of said plurality of cavities has a cavity length different from another of said plurality of cavities, the cavity length being in a direction parallel to a surface of the substrate on which the light emitting units are disposed, and
    one of said plurality of cavities comprises a three-element type compound semiconductor, and another of the plurality of cavities comprises a four-element type compound semiconductor.

18. A semiconductor laser apparatus according to claim 17, wherein:
said plurality of cavities is fabricated to have cavity lengths corresponding to oscillation wavelengths of lights emitted from respective cavities.

19. A semiconductor laser apparatus according to claim 17, wherein:
said plurality of cavities is fabricated to have cavity lengths all less than a length of said substrate.

20. A semiconductor laser apparatus according to claim 17, wherein:
a baffler member is disposed in between neighboring cavities.

21. A semiconductor laser apparatus according to claim 17, wherein:
one of said plurality of cavities emits laser light with a 780 nm band oscillation wavelength, and another of said plurality of cavities emits laser light with a 650 nm band oscillation wavelength.

22. A semiconductor laser apparatus according to claim 17, wherein:
one of said plurality of cavities is provided to be used for CD (compact disk), and another of said plurality of cavities is provided to be used for DCD (digital video disk).

23. A semiconductor laser apparatus having a plurality of cavities corresponding to a plurality of light emitting units disposed on a substrate, at least one of said plurality of cavities having a recess formed therein, a portion of the cavity on a first side of the recess being a light emitting portion and having a cavity length different from another of said plurality of cavities, a portion of the cavity on a side of the recess opposite the first side being a light receiving portion.

24. A semiconductor laser apparatus according to claim 23, wherein:
a first cavity of the cavities has a recess formed therein, a second cavity of the cavities has a recess formed therein, each of the first and second cavities has a light emitting portion on a first side of the respective recess and a light receiving portion on a side of the recess opposite the first side, and the light emitting portion of the first cavity has a length different than the light emitting portion of the second cavity.

* * * * *